(12) United States Patent
Song et al.

(10) Patent No.: US 10,991,438 B1
(45) Date of Patent: Apr. 27, 2021

(54) METHOD AND MEMORY USED FOR REDUCING PROGRAM DISTURBANCE BY ADJUSTING VOLTAGE OF DUMMY WORD LINE

(71) Applicant: Yangtze Memory Technologies Co., Ltd., Wuhan (CN)

(72) Inventors: Yali Song, Wuhan (CN); Jianquan Jia, Wuhan (CN); Kaikai You, Wuhan (CN); An Zhang, Wuhan (CN); XiangNan Zhao, Wuhan (CN); Ying Cui, Wuhan (CN); Shan Li, Wuhan (CN); Kaiwei Li, Wuhan (CN); Lei Jin, Wuhan (CN); Xueqing Huang, Wuhan (CN); Meng Lou, Wuhan (CN); Jinlong Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/799,806

(22) Filed: Feb. 24, 2020

Related U.S. Application Data

(63) Continuation of application No. PCT/CN2019/123978, filed on Dec. 9, 2019.

(51) Int. Cl.
*G11C 16/04* (2006.01)
*G11C 16/34* (2006.01)
*H01L 27/11582* (2017.01)
*H01L 27/11556* (2017.01)

(52) U.S. Cl.
CPC ...... *G11C 16/3427* (2013.01); *G11C 16/0483* (2013.01); *H01L 27/11556* (2013.01); *H01L 27/11582* (2013.01)

(58) Field of Classification Search
CPC ............ G11C 16/3427; G11C 16/0483; H01L 27/11556
USPC ...................................... 365/185.18
See application file for complete search history.

(56) References Cited

U.S. PATENT DOCUMENTS

| | | |
|---|---|---|
| 9,812,206 B2 | 11/2017 | Nam |
| 10,276,250 B1 | 4/2019 | Chen |
| 10,297,323 B2 | 5/2019 | Yu |
| 2006/0139997 A1* | 6/2006 | Park ................... G11C 16/3418 365/185.2 |

(Continued)

FOREIGN PATENT DOCUMENTS

| | | |
|---|---|---|
| CN | 102810332 A | 12/2012 |
| CN | 104143358 A | 11/2014 |

(Continued)

*Primary Examiner* — Vu A Le
(74) *Attorney, Agent, or Firm* — Winston Hsu

(57) ABSTRACT

A memory includes an upper deck and a lower deck. The upper deck includes a first upper dummy word line. The lower deck includes a first lower dummy word line. A method for reducing program disturbance of the memory includes adjusting a first upper bias voltage applied to the first upper dummy word line and/or a first upper threshold voltage of the first upper dummy word line to adjust a first difference between the first upper bias voltage and the first upper threshold voltage; and adjusting a first lower bias voltage applied to the first lower dummy word line and/or a first lower threshold voltage of the first lower dummy word line to adjust a second difference between the first lower bias voltage and the first lower threshold voltage.

20 Claims, 14 Drawing Sheets

(56) References Cited

U.S. PATENT DOCUMENTS

| | | | |
|---|---|---|---|
| 2009/0003067 A1* | 1/2009 | Kang | ............... G11C 16/0483 |
| | | | 365/185.13 |
| 2012/0307561 A1 | 12/2012 | Joo | |
| 2016/0012905 A1 | 1/2016 | Chang | |
| 2016/0343450 A1 | 11/2016 | Lee | |
| 2018/0019258 A1 | 1/2018 | Lee | |
| 2019/0156901 A1 | 5/2019 | Chen | |
| 2019/0198117 A1 | 6/2019 | Yu | |

FOREIGN PATENT DOCUMENTS

| | | |
|---|---|---|
| CN | 105280224 A | 1/2016 |
| CN | 106169307 A | 11/2016 |
| CN | 109961820 A | 7/2019 |

* cited by examiner

METHOD AND MEMORY USED FOR REDUCING PROGRAM DISTURBANCE BY ADJUSTING VOLTAGE OF DUMMY WORD LINE

CROSS REFERENCE TO RELATED APPLICATIONS

This application is a continuation of PCT Application No. PCT/CN2019/123978 filed on Dec. 9, 2019, the entire contents of which are incorporated herein by reference.

BACKGROUND OF THE INVENTION

1. Field of the Invention

The disclosure is related to a method and a memory for reducing program disturbance, and more particularly, a method and a memory for reducing program disturbance by adjusting voltage of a dummy word line.

2. Description of the Prior Art

In order to increase the capacity of a memory, a memory with a three-dimensional structure has been developed. For example, a three-dimensional stack NAND flash memory can be available presently.

A three-dimensional structure of a memory can include a plurality of layers so as to store more data on a same area. This solution has been proved to be effective for increasing capacity of memory.

However, the program disturbance will become more serious when the number of layers is increased. Program disturbance will lead to a higher failure rate of programming a memory. Hence, a solution for reducing program disturbance when operating a three-dimensional memory is in need in the field.

SUMMARY OF THE INVENTION

An embodiment discloses a method for reducing program disturbance of a memory. The memory includes an upper deck and a lower deck. The upper deck includes a first upper dummy word line. The lower deck includes a first lower dummy word line. The method includes adjusting a first upper bias voltage applied to the first upper dummy word line and/or a first upper threshold voltage of the first upper dummy word line to adjust a first difference between the first upper bias voltage and the first upper threshold voltage; and adjusting a first lower bias voltage applied to the first lower dummy word line and/or a first lower threshold voltage of the first lower dummy word line to adjust a second difference between the first lower bias voltage and the first lower threshold voltage.

Another embodiment includes a memory for reducing program disturbance. The memory includes an upper deck and a lower deck. The upper deck includes a first upper dummy word line configured to receive a first upper bias voltage and have a first upper threshold voltage. The lower deck includes a first lower dummy word line configured to receive a first lower bias voltage and have a first lower threshold voltage. The first upper bias voltage and/or the first upper threshold voltage is adjusted to adjust a first difference between the first upper bias voltage and the first upper threshold voltage. The first lower bias voltage and/or the first lower threshold voltage is adjusted to adjust a second difference between the first lower bias voltage and the first lower threshold voltage.

These and other objectives of the present invention will no doubt become obvious to those of ordinary skill in the art after reading the following detailed description of the preferred embodiment that is illustrated in the various figures and drawings.

DETAILED DESCRIPTION

In the text, when an item A and an item B are connected with the conjunction "and/or" to be "A and/or B", it indicates A, B or both of A and B.

Figure 1:
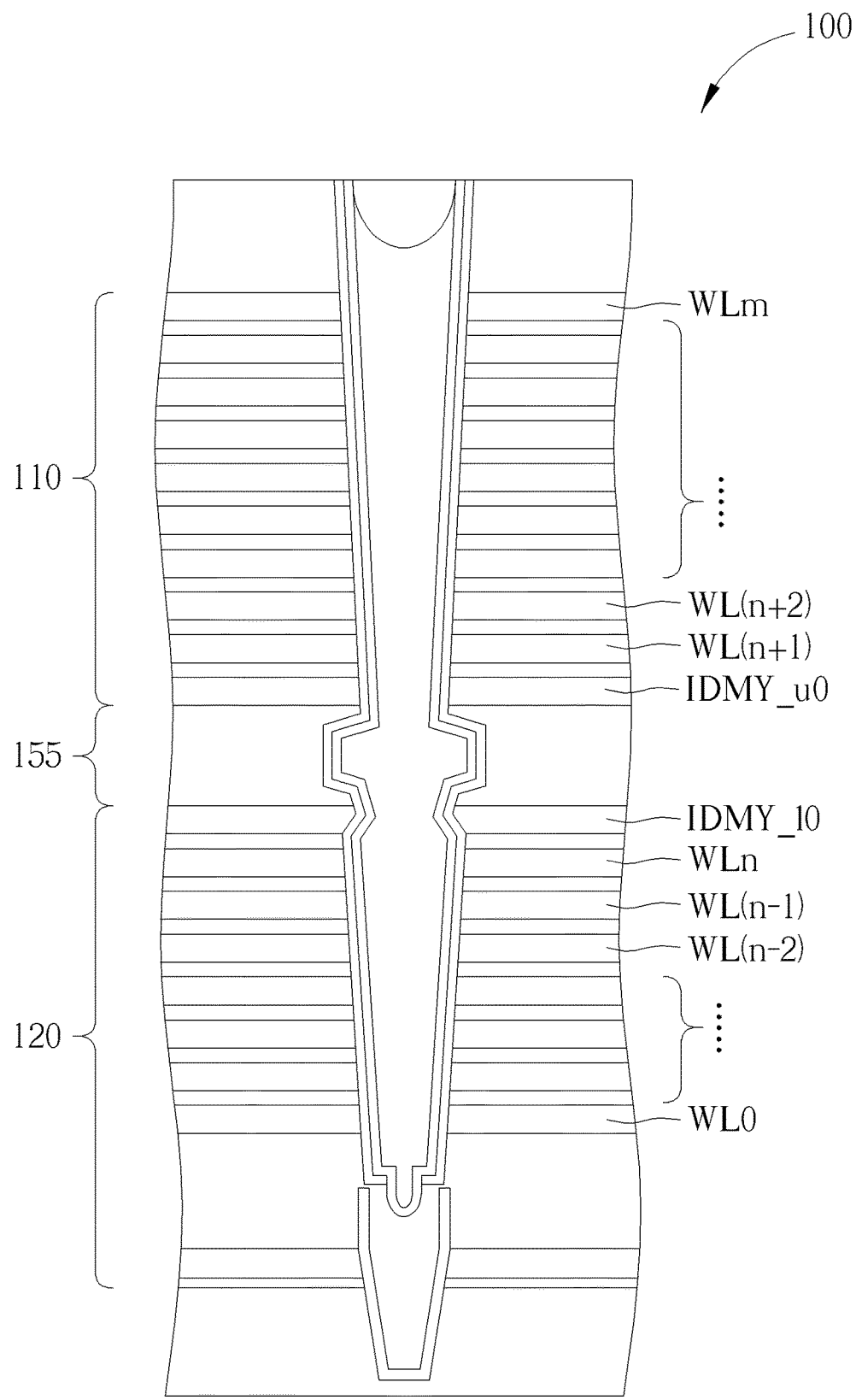
FIG. 1 illustrates a memory according to an embodiment.

FIG. 1 illustrates a memory 100 according to an embodiment. The memory 100 may include an upper deck 110 and a lower deck 120. The upper deck 110 may be formed above the lower deck 120. The memory 100 may further include a joint oxide layer 155 formed between the upper deck 110 and the lower deck 120.

As shown in FIG. 1, the upper deck 110 may include a first upper dummy word line IDMY_u0, and the lower deck 120 may include a first lower dummy word line IDMY_l0.

Figure 2:
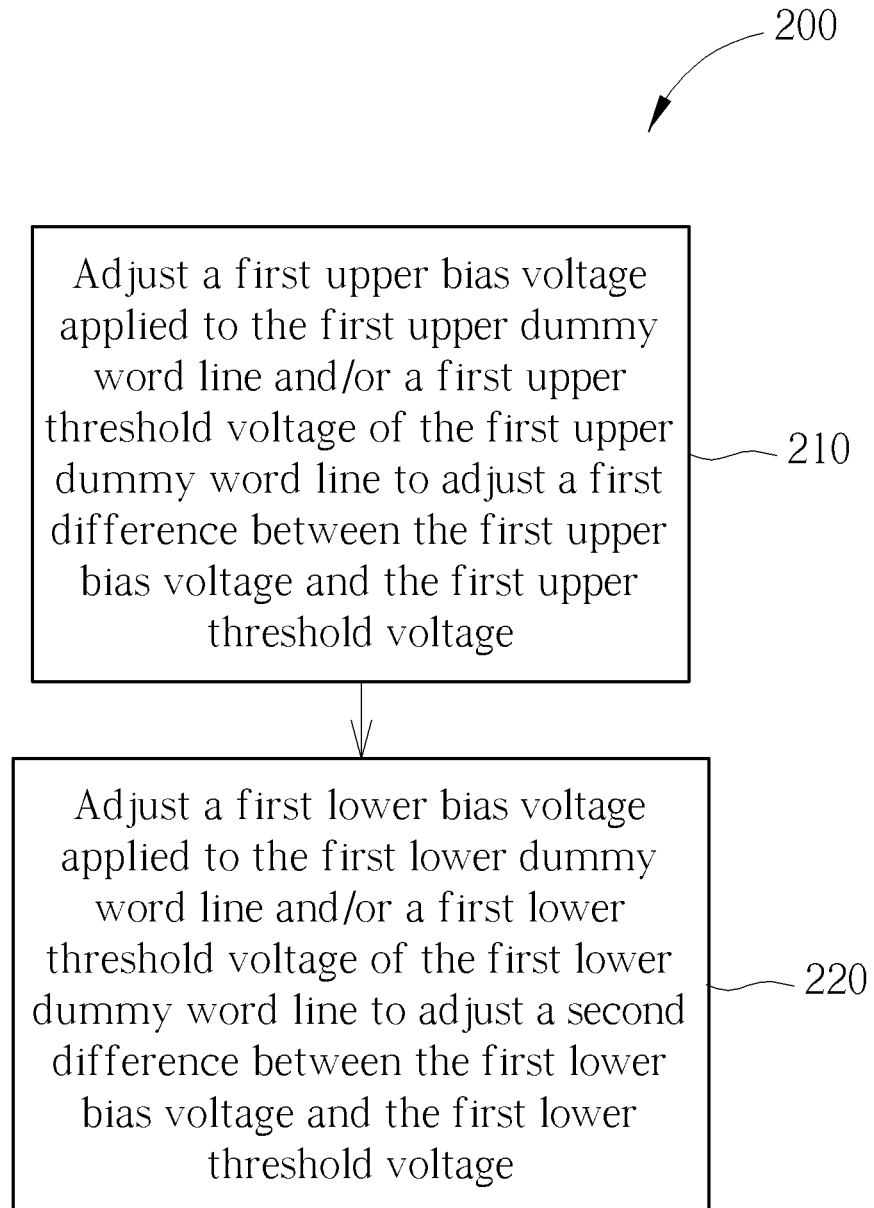
FIG. 2 is a flowchart of a method for reducing program disturbance of the memory of FIG. 1.

FIG. 2 is a flowchart of a method 200 for reducing program disturbance of the memory 100 of FIG. 1. The method 200 includes following steps.

Step 210: adjust a first upper bias voltage V_u0 applied to the first upper dummy word line IDMY_u0 and/or a first upper threshold voltage Vt_u0 of the first upper dummy word line IDMY_u0 to adjust a first difference $\Delta$V_u0 between the first upper bias voltage V_u0 and the first upper threshold voltage Vt_u0; and Step 220: adjust a first lower bias voltage V_l0 applied to the first lower dummy word line IDMY_l0 and/or a first lower threshold voltage Vt_l0 of the first lower dummy word line IDMY_l0 to adjust a second difference $\Delta$V_l0 between the first lower bias voltage V_l0 and the first lower threshold voltage Vt_l0.

FIG. 2 is merely an example, and the steps in FIG. 2 may be performed in any sequence. For example, Step 220 may be performed first. The steps may be performed concurrently.

ΔV_u0 and ΔV_10 in Step 210 and 220 may be expressed as the following equations:

$$\Delta V\_u0 = V\_u0 - Vt\_u0 \quad \text{(eq-1); and}$$

$$\Delta V\_10 = V\_10 - Vt\_10 \quad \text{(eq-2).}$$

As described in Step 210 and Step 220, V_u0 and/or Vt_u0 may be adjusted to adjust ΔV_u0. V_10 and/or Vt_10 may be adjusted to adjust ΔV_10. By adjusting the first difference ΔV_u0 and the second difference ΔV_10 as below, program disturbance may be reduced.

As shown in FIG. 1, a word line WLn may be at the first layer below the first lower dummy word line IDMY_10. A word line WL(n−1) may be at the second layer below the first lower dummy word line IDMY_10. Word lines WL(n−2) to WL0 may be at layers below the layer of the word line WL(n−1).

A word line WL(n+1) may be at the first layer above the first upper dummy word line IDMY_u0. A word line WL(n+2) may be at the second layer above the first upper dummy word line IDMY_u0. Word lines WL(n+3) to WLm may be at layers above the layer of the word line WL(n+2).

Regarding the adjustment of the first difference ΔV_u0 and the second difference ΔV_10, when programming a word line of the word lines WL(n−1) to WL(n+2), the first difference ΔV_u0 may be adjusted to be higher than a threshold TH1. The second difference ΔV_10 may be adjusted to be higher than the threshold TH1. In other words, after the adjustment, ΔV_u0=V_u0 Vt_u0>TH1, and ΔV_10=V_10−Vt_10>TH1. For example, the threshold TH1 may be 7 volts.

When programming a word line of the word lines WL(n+3) to WLm, the first difference ΔV_u0 may be adjusted to be lower than a threshold TH2. The second difference ΔV_10 may be adjusted to be lower than the threshold TH2. In other words, after the adjustment, ΔV_u0=V_u0−Vt_u0<TH2, and ΔV_10=V_10−Vt_10<TH2. For example, the threshold TH2 may be 7 volts.

When programming a word line of the word lines WL0 to WL(n−2), the first difference ΔV_u0 and the second difference ΔV_10 may not be limited; however, according to experiments, the first difference ΔV_u0 and the second difference ΔV_10 may be higher than a threshold TH3. For example, the threshold TH3 may be 3 volts.

Figure 3:
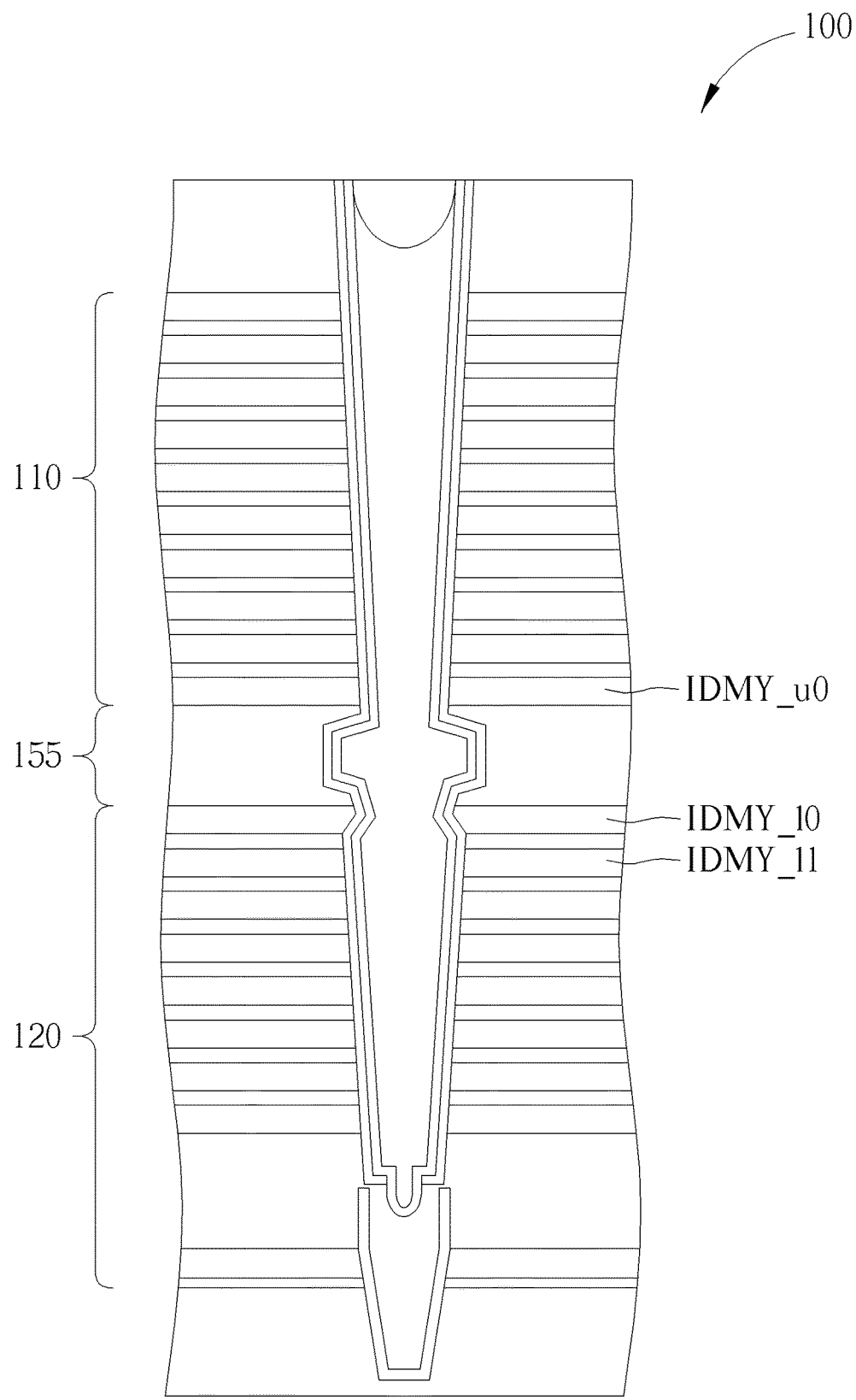
FIG. 3 illustrates a memory according to another embodiment.

FIG. 3 illustrates the memory 100 according to another embodiment. The structure shown in FIG. 3 may be similar to that shown in FIG. 1. As shown in FIG. 3, the lower deck 120 may further include a second lower dummy word line IDMY_11.

Figure 4:
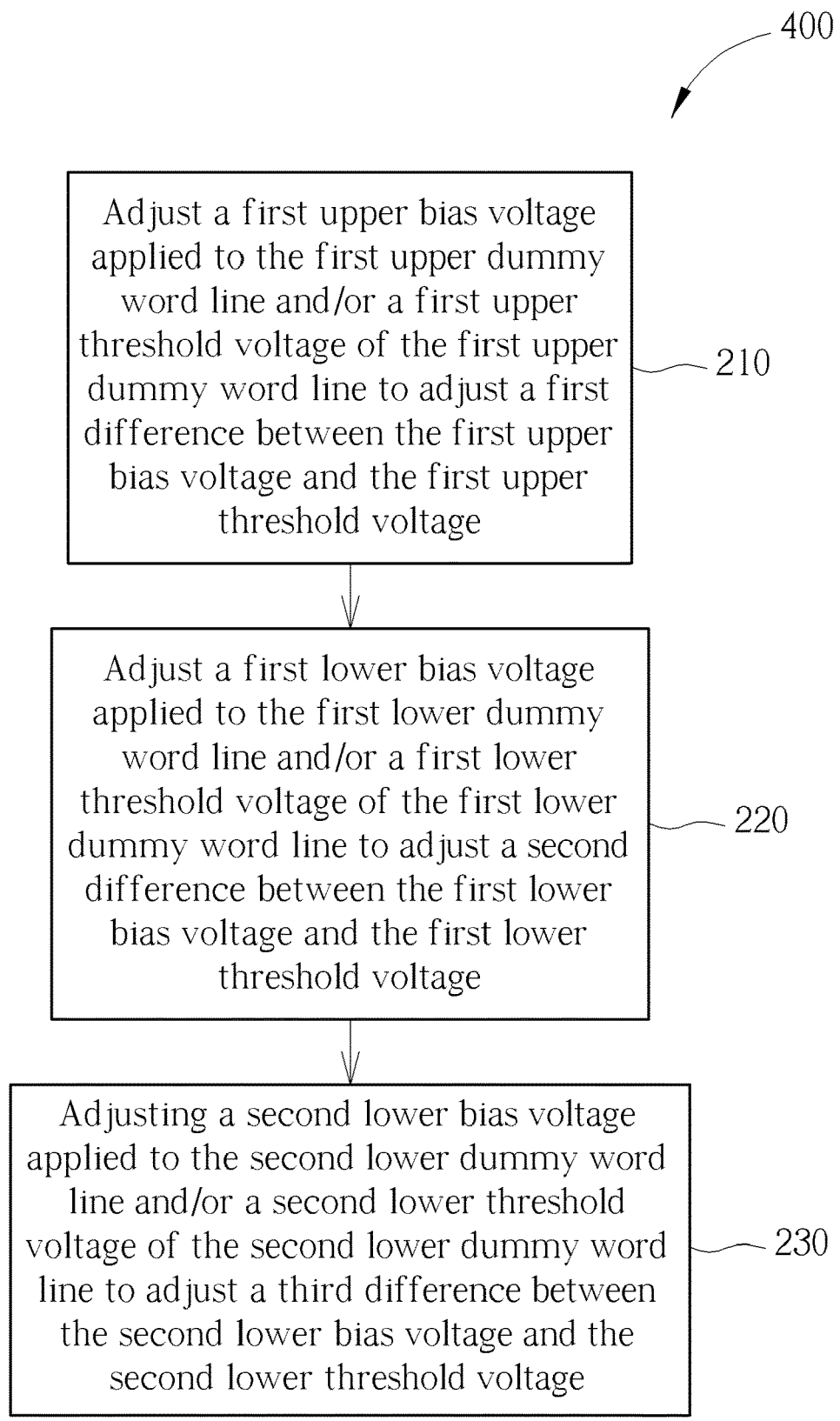
FIG. 4 is a flowchart of a method for reducing program disturbance of the memory of FIG. 3.

FIG. 4 is a flowchart of a method 400 for reducing program disturbance of the memory 100 of FIG. 3. The method 400 may include following steps.

Step 210: adjust a first upper bias voltage V_u0 applied to the first upper dummy word line IDMY_u0 and/or a first upper threshold voltage Vt_u0 of the first upper dummy word line IDMY_u0 to adjust a first difference ΔV_u0 between the first upper bias voltage V_u0 and the first upper threshold voltage Vt_u0;

Step 220: adjust a first lower bias voltage V_10 applied to the first lower dummy word line IDMY_10 and/or a first lower threshold voltage Vt_10 of the first lower dummy word line IDMY_10 to adjust a second difference ΔV_10 between the first lower bias voltage V_10 and the first lower threshold voltage Vt_10; and Step 230: adjusting a second lower bias voltage V_11 applied to the second lower dummy word line IDMY_11 and/or a second lower threshold voltage Vt_11 of the second lower dummy word line IDMY_11 to adjust a third difference ΔV_11 between the second lower bias voltage V_11 and the second lower threshold voltage Vt_11.

FIG. 4 is merely an example, and the steps in FIG. 4 may be performed in any sequence. For example, Step 220 or Step 230 may be performed before Step 210. The steps may be performed concurrently.

ΔV_u0 and ΔV_10 in Steps 210 and 220 may be expressed as the equations (eq-1) and (eq-2) above. ΔV_11 in Step 230 may be expressed as the following equation.

$$\Delta V\_11 = V\_11 - Vt\_11 \quad \text{(eq-3).}$$

As described in Step 210 to Step 230, the first difference ΔV_u0, the second difference ΔV_10 and the third difference ΔV_11 may be adjusted as below to reduce program disturbance.

When programming a word line of the upper deck 110, the first difference ΔV_u0 may be adjusted to be higher than a threshold TH4, the second difference ΔV_10 may be adjusted to be lower than the threshold TH4, and the third difference ΔV_11 may be adjusted to be lower than the threshold TH4. In other words, after the adjustment, ΔV_u0=V_u0−Vt_u0>TH4, ΔV_10=V_10−Vt_10<TH4, and ΔV_11=V_11−Vt_11<TH4. For example, the threshold TH4 may be 7 volts.

In addition, according to an embodiment, a condition (c-1) may also have to be met for reducing program disturbance of the memory 100 of FIG. 3.

The condition (c-1) may include that a difference between the first difference ΔV_u0 and the second difference ΔV_10 may be within a predetermined range, and another difference between the first difference ΔV_u0 and the third difference ΔV_11 may be within the predetermined range.

The predetermined range related to the condition (c-1) may be within a level L1 and a level L2 higher than the level L1. Hence, in other words, the condition (c-1) may be expressed as L1<(ΔV_u0−ΔV_10)<L2, and L1<(ΔV_u0−ΔV_11)<L2. For example, the level L1 may be 3 volts, and the second level L2 may be 7 volts.

Regarding FIG. 3, the equations and inequalities related to the first difference ΔV_u0, the second difference ΔV_10 and the third difference ΔV_11 mentioned above may be applied when programming a word line of the upper deck 110.

When programming a word line of the lower deck 120, the first difference ΔV_u0, the second difference ΔV_10 and the third difference ΔV_11 may not be limited; however, according to experiments, the differences ΔV_u0, ΔV_10 and ΔV_11 may be higher than a threshold such as 3 volts.

Figure 5:
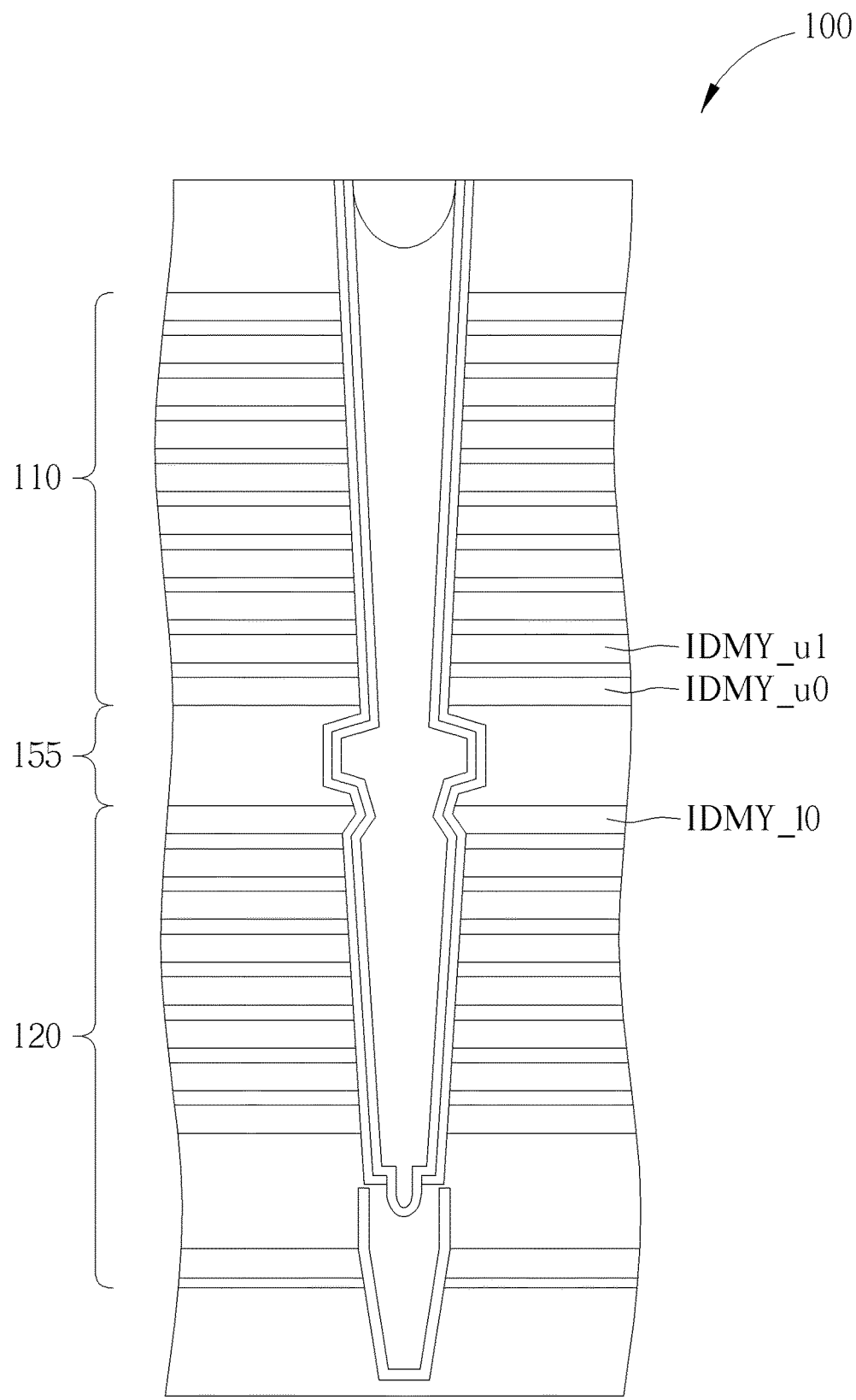
FIG. 5 illustrates a memory according to another embodiment.

FIG. 5 illustrates the memory 100 according to another embodiment. The structure shown in FIG. 5 may be similar to that shown in FIG. 1. As shown in FIG. 5, the upper deck 110 may further include a second upper dummy word line IDMY_u1.

Figure 6:
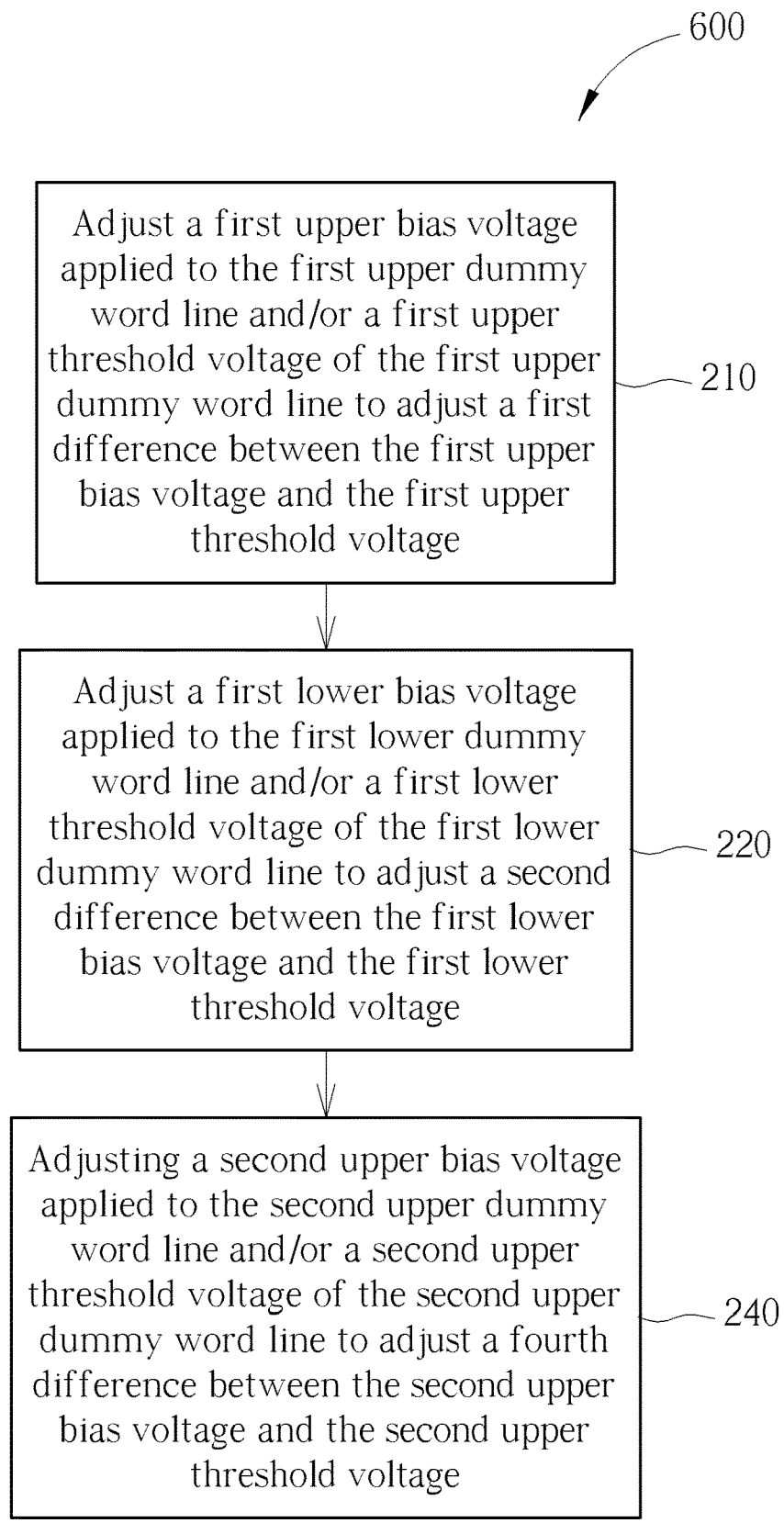
FIG. 6 is a flowchart of a method for reducing program disturbance of the memory of FIG. 5.

FIG. 6 is a flowchart of a method 600 for reducing program disturbance of the memory 100 of FIG. 5. The method 600 may include following steps.

Step 210: adjust a first upper bias voltage V_u0 applied to the first upper dummy word line IDMY_u0 and/or a first upper threshold voltage Vt_u0 of the first upper dummy word line IDMY_u0 to adjust a first difference ΔV_u0 between the first upper bias voltage V_u0 and the first upper threshold voltage Vt_u0;

Step 220: adjust a first lower bias voltage V_10 applied to the first lower dummy word line IDMY_10 and/or a first lower threshold voltage Vt_10 of the first lower dummy word line IDMY_10 to adjust a second difference $\Delta V\_10$ between the first lower bias voltage V_10 and the first lower threshold voltage Vt_10; and Step 240: adjusting a second upper bias voltage V_u1 applied to the second upper dummy word line IDMY_u1 and/or a second upper threshold voltage Vt_u1 of the second upper dummy word line IDMY_u1 to adjust a fourth difference $\Delta V\_u1$ between the second upper bias voltage V_u1 and the second upper threshold voltage Vt_u1.

FIG. 6 is merely an example, and the steps in FIG. 6 may be performed in any sequence. For example, Step 220 or Step 240 may be performed before Step 210. The steps may be performed concurrently.

$\Delta V\_u0$ and $\Delta V\_10$ in Step 210 and 220 may be expressed as the equations (eq-1) and (eq-2) above. $\Delta V\_u1$ in Step 240 may be expressed as the following equation.

$$\Delta V\_u1 = V\_u1 - Vt\_u1 \qquad \text{(eq-4)}.$$

As described in Step 210, Step 220 and Step 230, the first difference $\Delta V\_u0$, the second difference $\Delta V\_10$ and the fourth difference $\Delta V\_u1$ may be adjusted as below to reduce program disturbance.

When programming a word line of the upper deck 110, the first difference $\Delta V\_u0$ may be adjusted to be lower than a threshold TH5, the second difference $\Delta V\_10$ may be adjusted to be lower than the threshold TH5, and the fourth difference $\Delta V\_u1$ may be adjusted to be higher than the threshold TH5. In other words, after the adjustment, $\Delta V\_u0 = V\_u0 - Vt\_u0 < TH5$, $\Delta V\_10 = V\_10 - Vt\_10 < TH5$, and $\Delta V\_u1 = V\_u1 - Vt\_u1 > TH5$. For example, the threshold TH5 may be 7 volts.

In addition, according to an embodiment, a condition (c-2) may also have to be met for reducing program disturbance of the memory 100 of FIG. 5.

The condition (c-2) may include that a difference between the fourth difference $\Delta V\_u1$ and the first difference $\Delta V\_u0$ may be within a predetermined range, and another difference between the fourth difference $\Delta V\_u1$ and the second difference $\Delta V\_10$ may be within the predetermined range.

The predetermined range related to the condition (c-2) may be within a level L3 and a level L4 higher than the level L3. Hence, in other words, the condition (c-2) may be expressed as $L3 < (\Delta V\_u1 - \Delta V\_u0) < L4$, and $L3 < (\Delta V\_u1 - \Delta V\_10) < L4$. For example, the level L3 may be 3 volts, and the level L4 may be 7 volts.

Regarding FIG. 5, the equations and inequalities related to the differences $\Delta V\_u0$, $\Delta V\_10$ and $\Delta V\_u1$ mentioned above may be applied when programming a word line of the upper deck 110.

When programming a word line of the lower deck 120, the differences $\Delta V\_u0$, $\Delta V\_10$ and $\Delta V\_u1$ may not be limited; however, according to experiments, the differences $\Delta V\_u0$, $\Delta V\_10$ and $\Delta V\_u1$ may be higher than a threshold such as 3 volts.

Figure 7:
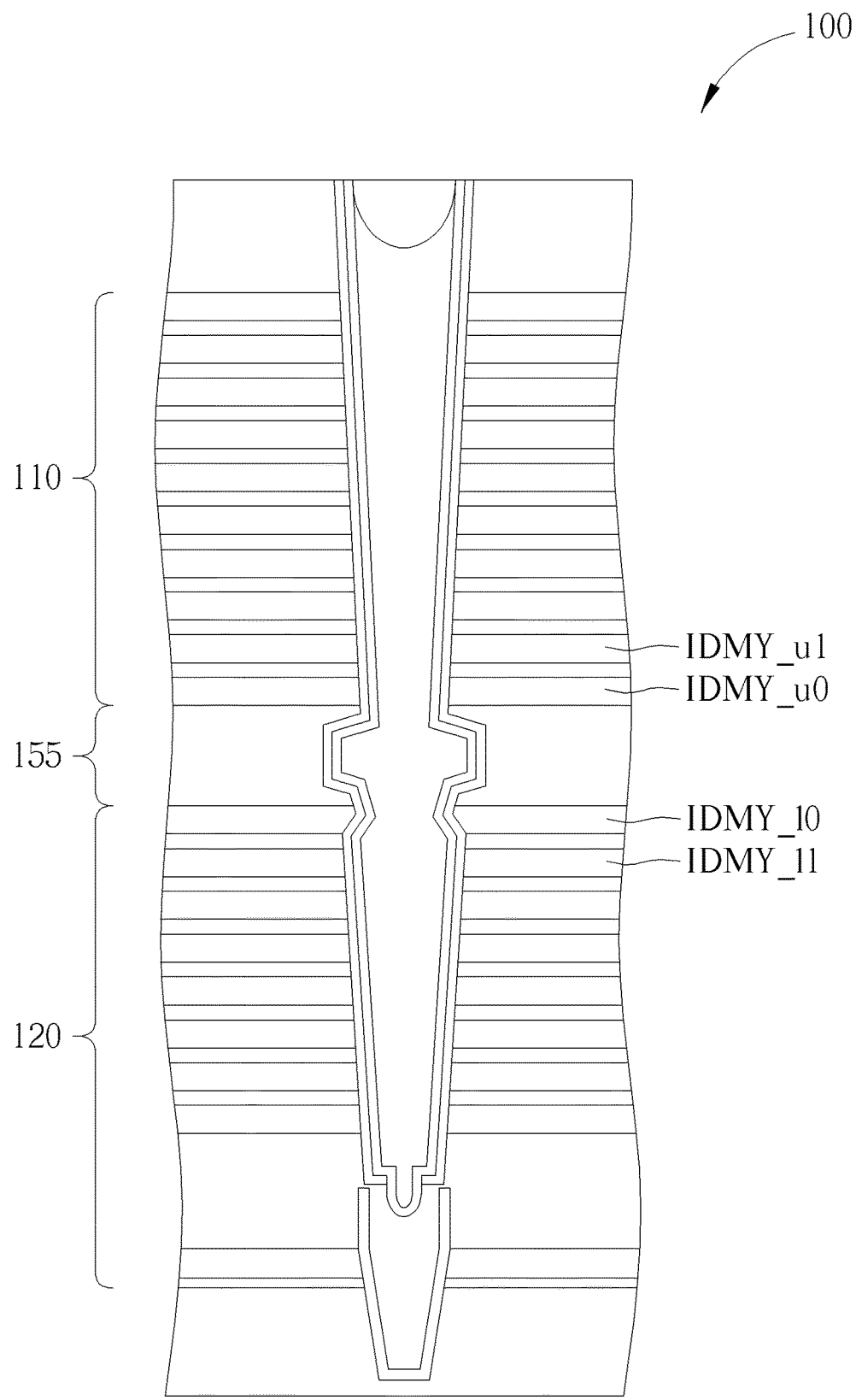
FIG. 7 illustrates a memory according to another embodiment.

FIG. 7 illustrates the memory 100 according to another embodiment. The structure shown in FIG. 7 may be similar to that shown in FIG. 1. Compared with FIG. 1, in FIG. 7, the upper deck 110 may further include the second upper dummy word line IDMY_u1, and the lower deck 120 may further include the second lower dummy word line IDMY_11.

Figure 8:
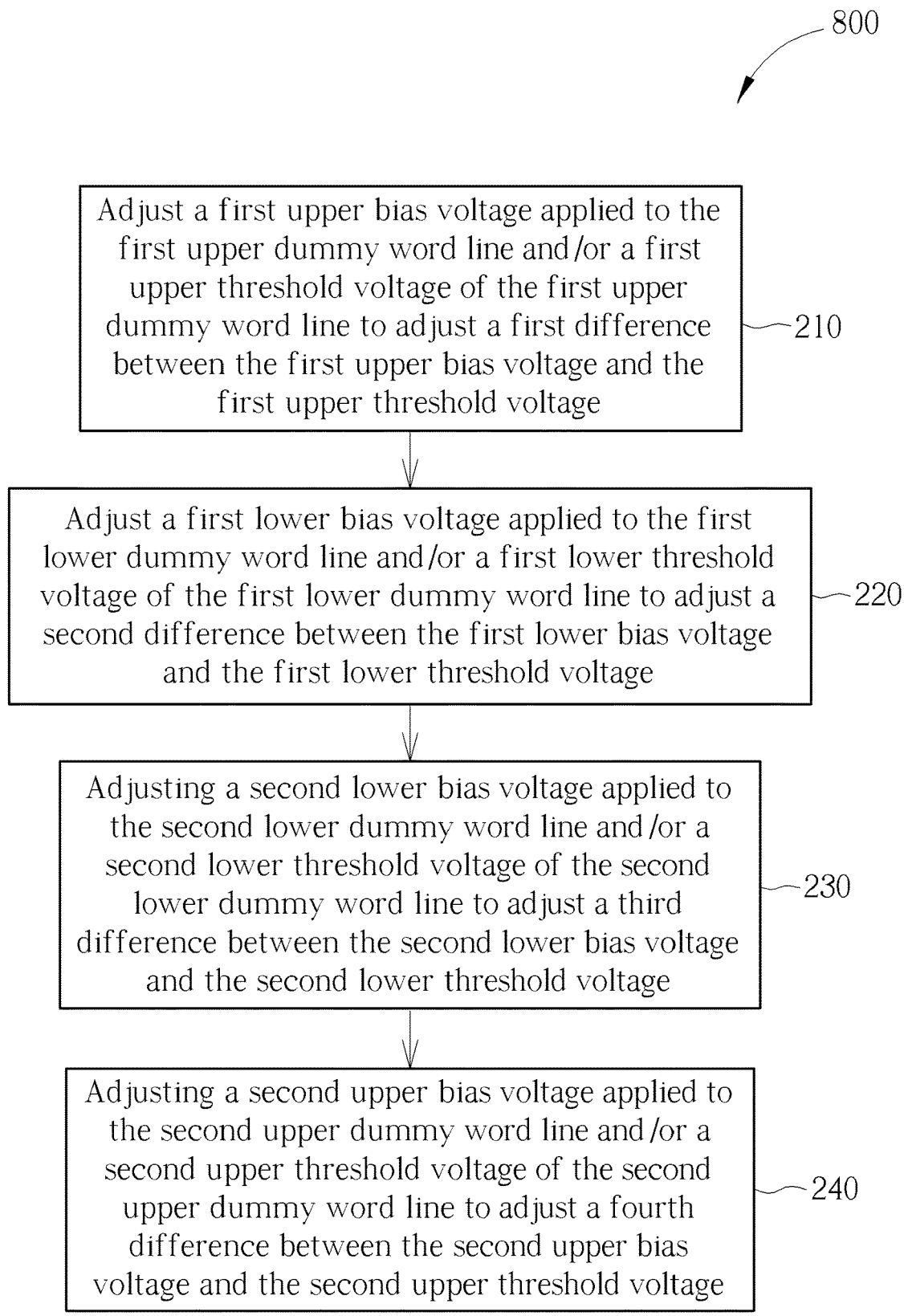
FIG. 8 is a flowchart of a method for reducing program disturbance of the memory of FIG. 7.

FIG. 8 is a flowchart of a method 800 for reducing program disturbance of the memory 100 of FIG. 7. The method 800 may include following steps.

Step 210: adjust a first upper bias voltage V_u0 applied to the first upper dummy word line IDMY_u0 and/or a first upper threshold voltage Vt_u0 of the first upper dummy word line IDMY_u0 to adjust a first difference $\Delta V\_u0$ between the first upper bias voltage V_u0 and the first upper threshold voltage Vt_u0;

Step 220: adjust a first lower bias voltage V_10 applied to the first lower dummy word line IDMY_10 and/or a first lower threshold voltage Vt_10 of the first lower dummy word line IDMY_10 to adjust a second difference $\Delta V\_10$ between the first lower bias voltage V_10 and the first lower threshold voltage Vt_10;

Step 230: adjusting a second lower bias voltage V_11 applied to the second lower dummy word line IDMY_11 and/or a second lower threshold voltage Vt_11 of the second lower dummy word line IDMY_11 to adjust a third difference $\Delta V\_11$ between the second lower bias voltage V_11 and the second lower threshold voltage Vt_11; and Step 240: adjusting a second upper bias voltage V_u1 applied to the second upper dummy word line IDMY_u1 and/or a second upper threshold voltage Vt_u1 of the second upper dummy word line IDMY_u1 to adjust a fourth difference $\Delta V\_u1$ between the second upper bias voltage V_u1 and the second upper threshold voltage Vt_u1.

FIG. 8 is merely an example, and the steps in FIG. 8 may be performed in any sequence. For example, Step 220, Step 230 or Step 240 may be performed before Step 210. The steps may be performed concurrently.

$\Delta V\_u0$, $\Delta V\_10$, $\Delta V\_11$ and $\Delta V\_u1$ in Step 210 to Step 240 may be expressed as the equations (eq-1) to (eq-4) described above.

As described in Step 210 to Step 240, the first difference $\Delta V\_u0$, the second difference $\Delta V\_10$, the third difference $\Delta V\_11$ and the fourth difference $\Delta V\_u1$ may be adjusted as below to reduce program disturbance.

When programming a word line of the upper deck 110, the first difference $\Delta V\_u0$ may be adjusted to be lower than a threshold TH11. The second difference $\Delta V\_10$ may be adjusted to be lower than a second threshold TH12. The third difference $\Delta V\_11$ may be adjusted to be lower than the first threshold TH11. The fourth difference $\Delta V\_u1$ may be adjusted to be higher than the second threshold TH12. In other words, after the adjustment, $\Delta V\_u0 = V\_u0 - Vt\_u0 < TH11$, $\Delta V\_10 = V\_10 - Vt\_10 < TH12$, $\Delta V\_11 = V\_11 - Vt\_11 < TH11$, and $\Delta V\_u1 = V\_u1 - Vt\_u1 > TH12$. For example, the first threshold TH11 may be 11 volts, and the second threshold TH12 may be 7 volts.

In addition, according to an embodiment, one of a condition (c-3) and a condition (c-4) may also have to be met for reducing program disturbance of the memory 100 of FIG. 7.

The condition (c-3) may include that a difference between the fourth difference $\Delta V\_u1$ and the first difference $\Delta V\_u0$ may be within a predetermined range, and another difference between the fourth difference $\Delta V\_u1$ and the second difference $\Delta V\_10$ may within the predetermined range.

The predetermined range related to the condition (c-3) may be within a level L5 and a level L6 higher than the level L5. Hence, in other words, the condition (c-3) may be expressed as $L5 < (\Delta V\_u1 - \Delta V\_u0) < L6$, and $L5 < (\Delta V\_u1 - \Delta V\_10) < L6$. For example, the level L5 may be 3 volts, and the level L6 may be 7 volts.

The condition (c-4) may include that a difference between the fourth difference $\Delta V\_u1$ and the second difference $\Delta V\_10$ may be within a predetermined range, and another difference between the fourth difference $\Delta V\_u1$ and the third difference $\Delta V\_11$ may be within the predetermined range.

The predetermined range related to the condition (c-4) may be within a level L7 and a level L8 higher than the level L7. Hence, in other words, the condition (c-4) may be expressed as $L7<(\Delta V\_u1-\Delta V\_10)<L8$, and $L7<(\Delta V\_u1-\Delta V\_11)<L8$. For example, the level L7 may be 3 volts, and the level L8 may be 7 volts.

Regarding FIG. 7, the equations and inequalities related to the differences $\Delta V\_u0$, $\Delta V\_10$, $\Delta V\_11$ and $\Delta V\_u1$ mentioned above may be applied when programming a word line of the upper deck 110.

When programming a word line of the lower deck 120, the differences $\Delta V\_u0$, $\Delta V\_10$, $\Delta V\_11$ and $\Delta V\_u1$ may not be limited; however, according to experiments, the differences $\Delta V\_u0$, $\Delta V\_10$, $\Delta V\_11$ and $\Delta V\_u1$ may be higher than a threshold such as 3 volts.

Figure 9:
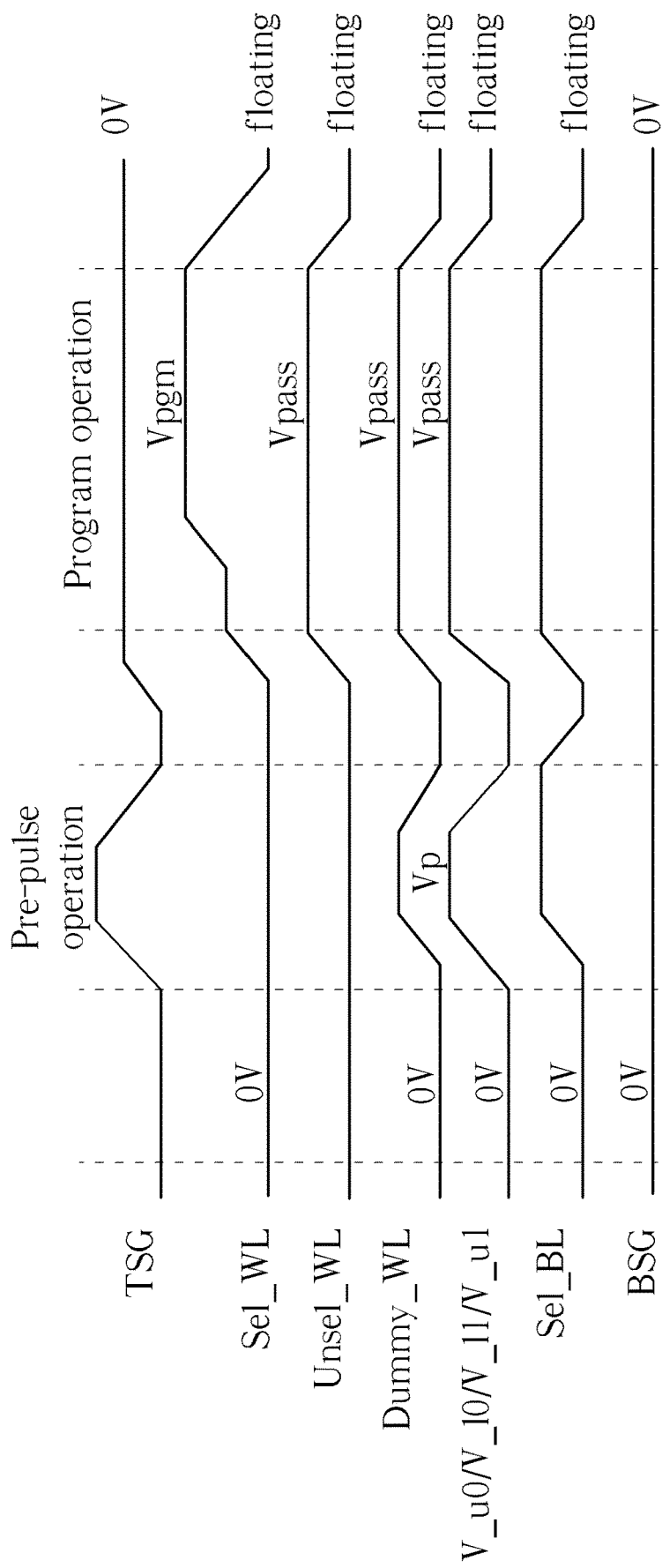
FIG. 9 is a waveform of controlling the memory of FIG. 7.

FIG. 9 is a waveform of controlling the memory 100 of FIG. 7. According to an embodiment, the memory 100 may further include a top select gate electrode (denoted as TSG), a select word line (denoted as Sel_WL), an unselect word line (denoted as Unsel_WL), a dummy word line (denoted as Dummy_WL), a select bit line (denoted as Sel_BL) and a bottom select gate electrode (denoted as BSG) used for controlling both of the upper deck 110 and the lower deck 120.

As shown in FIG. 9, before a program operation, a pre-pulse operation may be performed. The pre-pulse operation may be performed to avoid failure of the program operation.

As shown in FIG. 9, before the pre-pulse operation, 0 volts may be applied to the select word line (Sel_WL), the dummy word line (Dummy_WL), the select bit line (Sel_BL) and the bottom select gate electrode (BSG). The first upper bias voltage V_u0, the first lower bias voltage V_10, the second lower bias voltage V_11 and the second upper bias voltage V_u1 may be set as 0 volts.

The first upper bias voltage V_u0, the first lower bias voltage V_10, the second lower bias voltage V_11 and the second upper bias voltage V_u1 may be set to a pre-pulse level Vp during the pre-pulse operation. Then, the first upper bias voltage V_u0, the first lower bias voltage V_10, the second lower bias voltage V_11 and the second upper bias voltage V_u1 may be set to a program level Vpass during the program operation.

During the program operation, a voltage of the program level Vpass may be applied to the unselect word line (Unsel_WL) and the dummy word line (Dummy_WL). A voltage applied to the select word line (Sel_WL) may be increased to a level Vpgm.

As shown in FIG. 9, during the program operation, 0 volts may be applied to the top select gate electrode (TSG) and the bottom select gate electrode (BSG). After the program operation, the select word line (Sel_WL), the unselect word line (Unsel_WL), the dummy word line (Dummy_WL), the select bit line (Sel_BL) and the bias voltages V_u0, V_10, V_11 and V_u1 may be set as floating.

In FIG. 9, the pre-pulse level Vp may be higher than a maximum allowable level Vt max of the first upper threshold voltage Vt_u0, the first lower threshold voltage Vt_10, the second lower threshold voltage Vt_11 and the second upper threshold voltage Vt_u1.

As FIG. 9, the bias voltages V_u0, V_10, V_11 and V_u1 may be supplied by the same voltage source to reduce the number of voltage sources.

Figure 10:
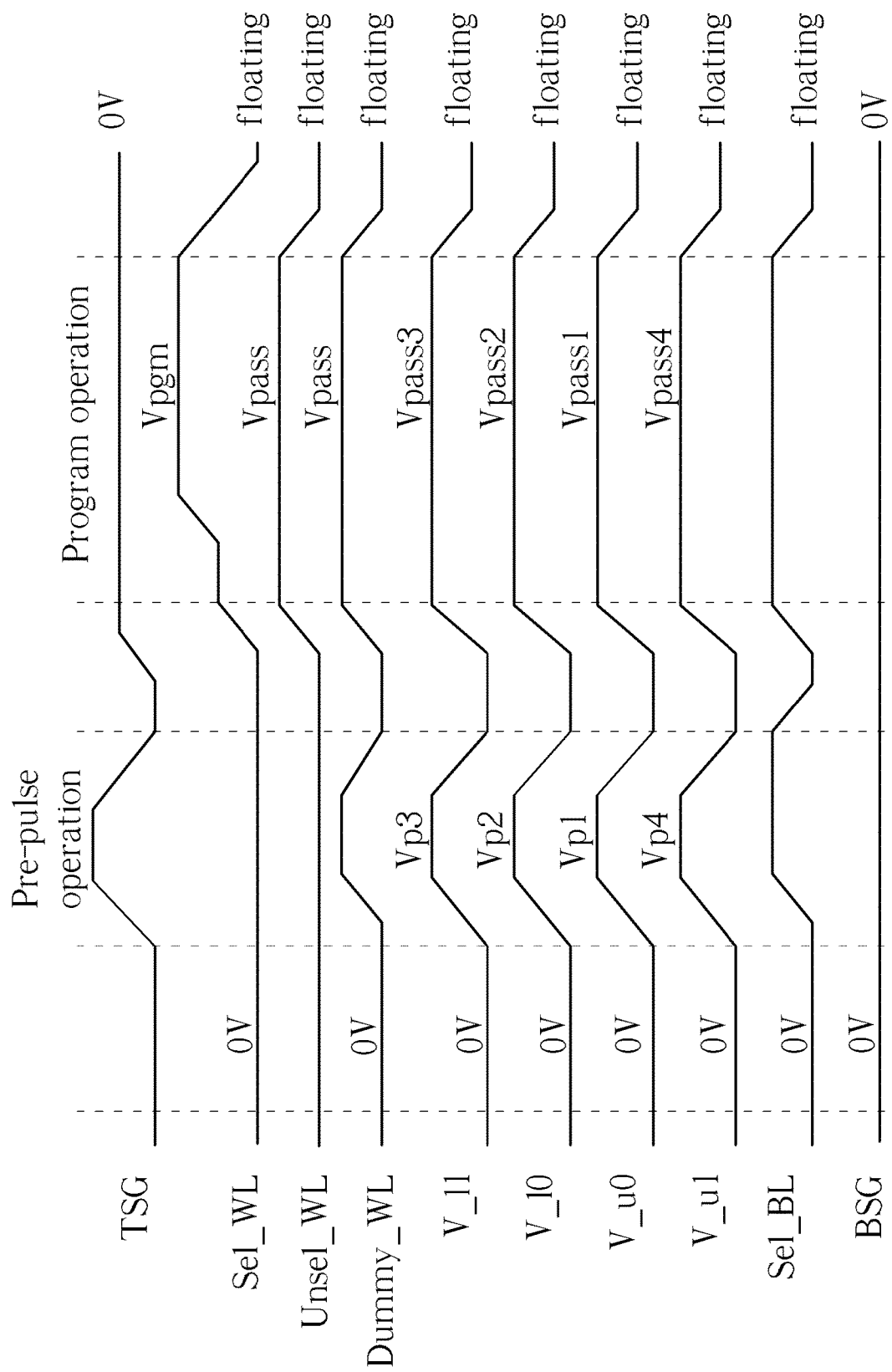
FIG. 10 is a waveform of controlling the memory of FIG. 7 according to another embodiment.
Figure 11:
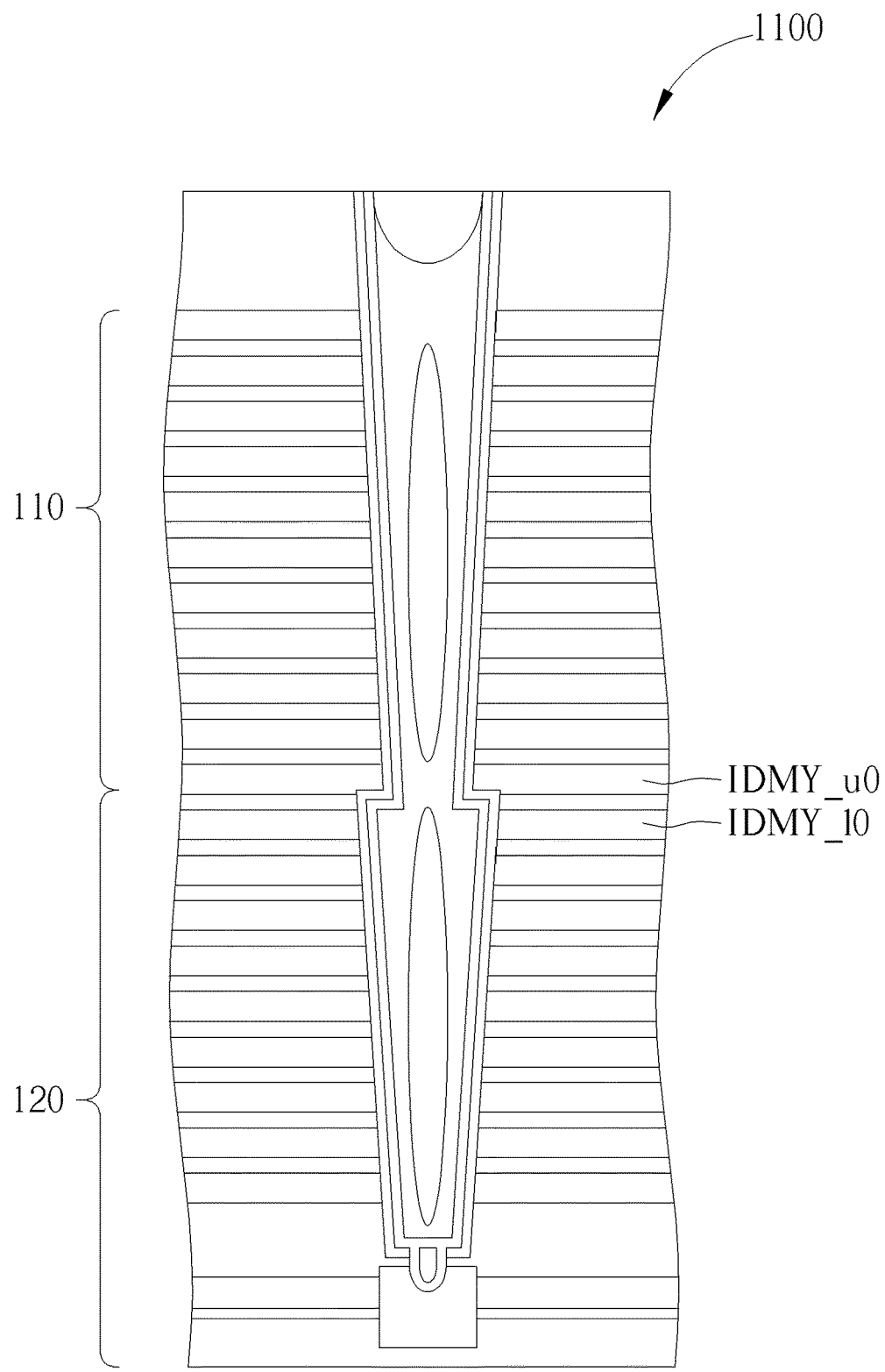
FIG. 11 to FIG. 14 illustrate a memory according to different embodiments.
Figure 12:
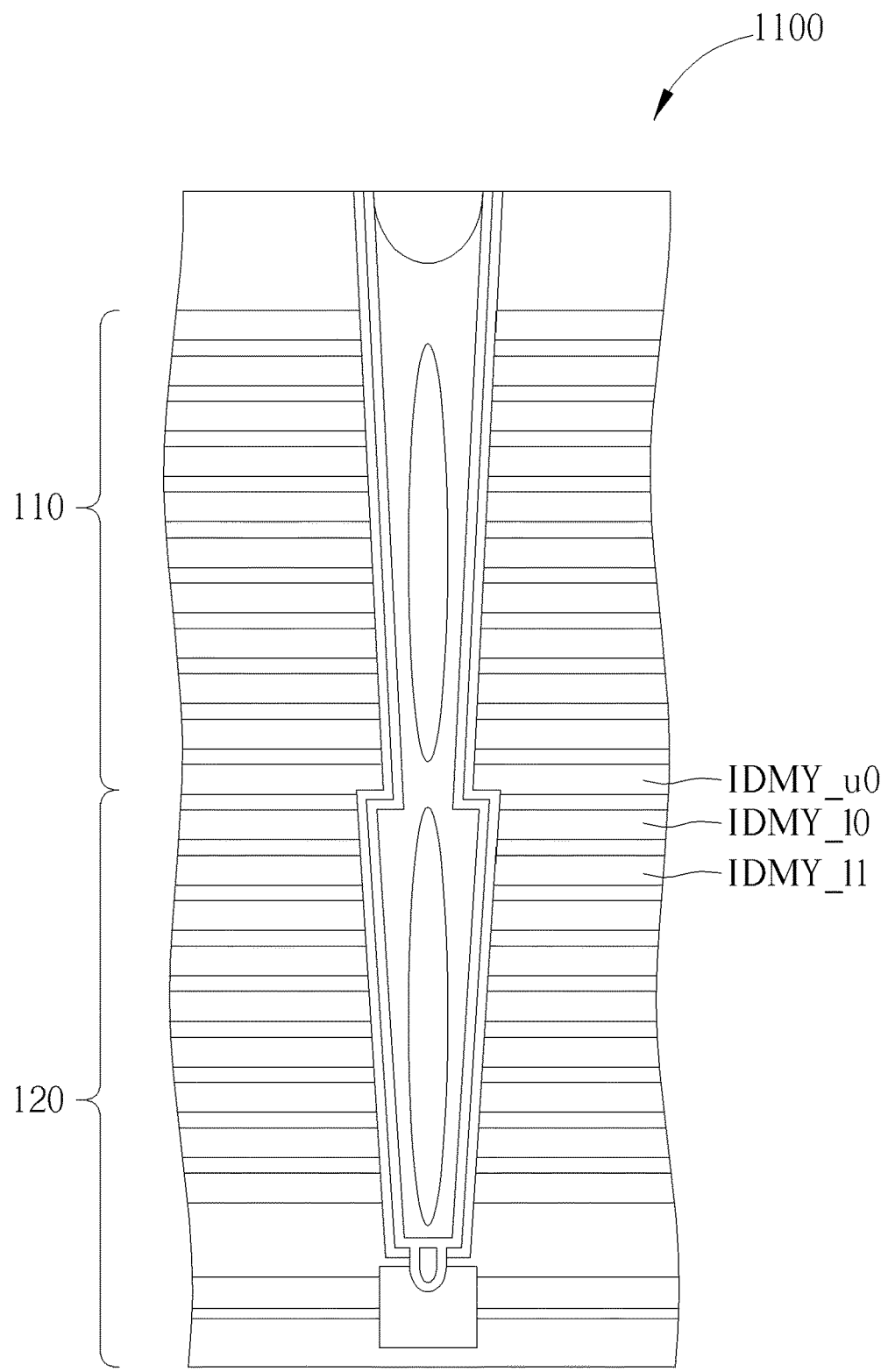
Figure 13:
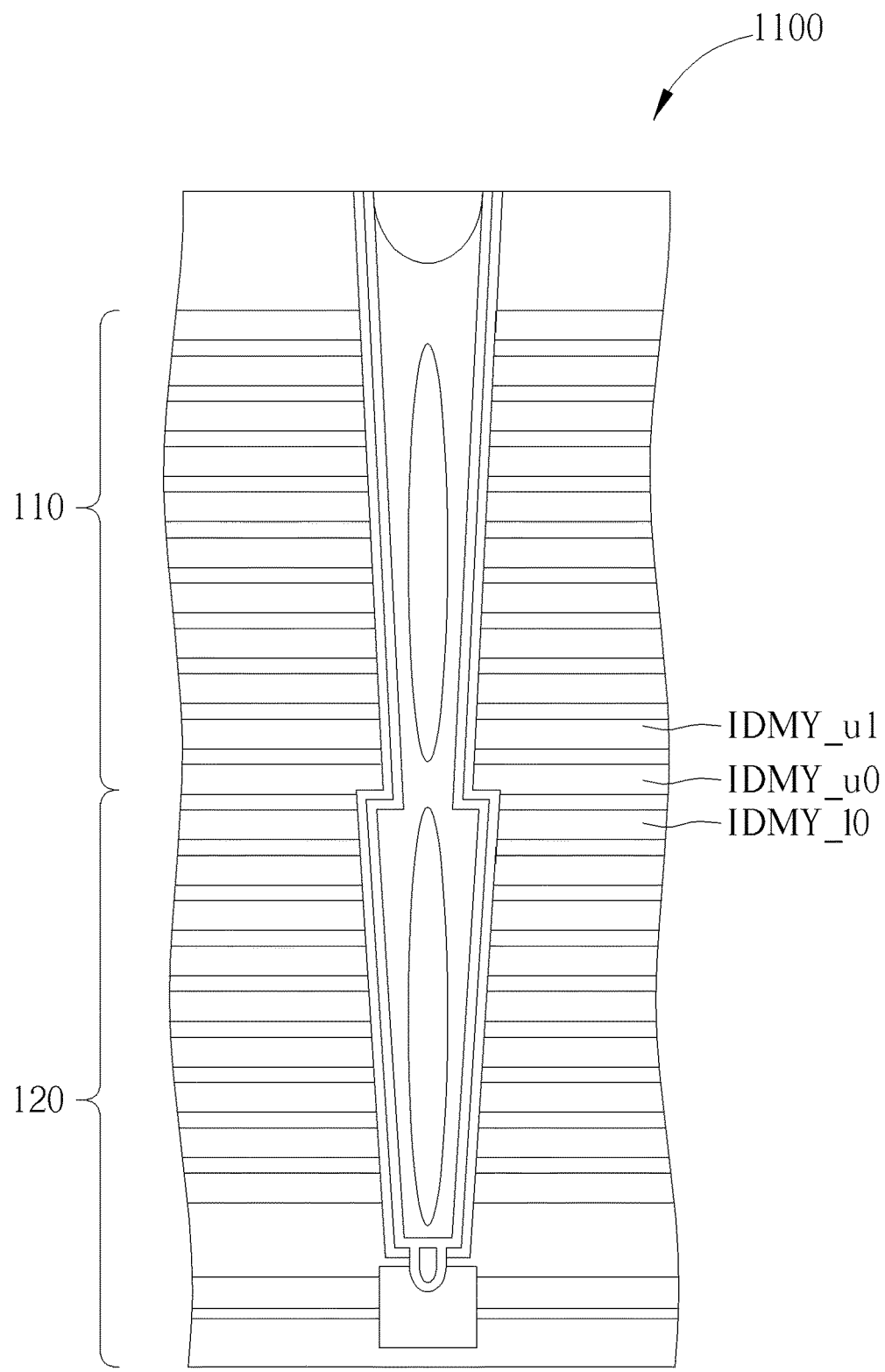
Figure 14:
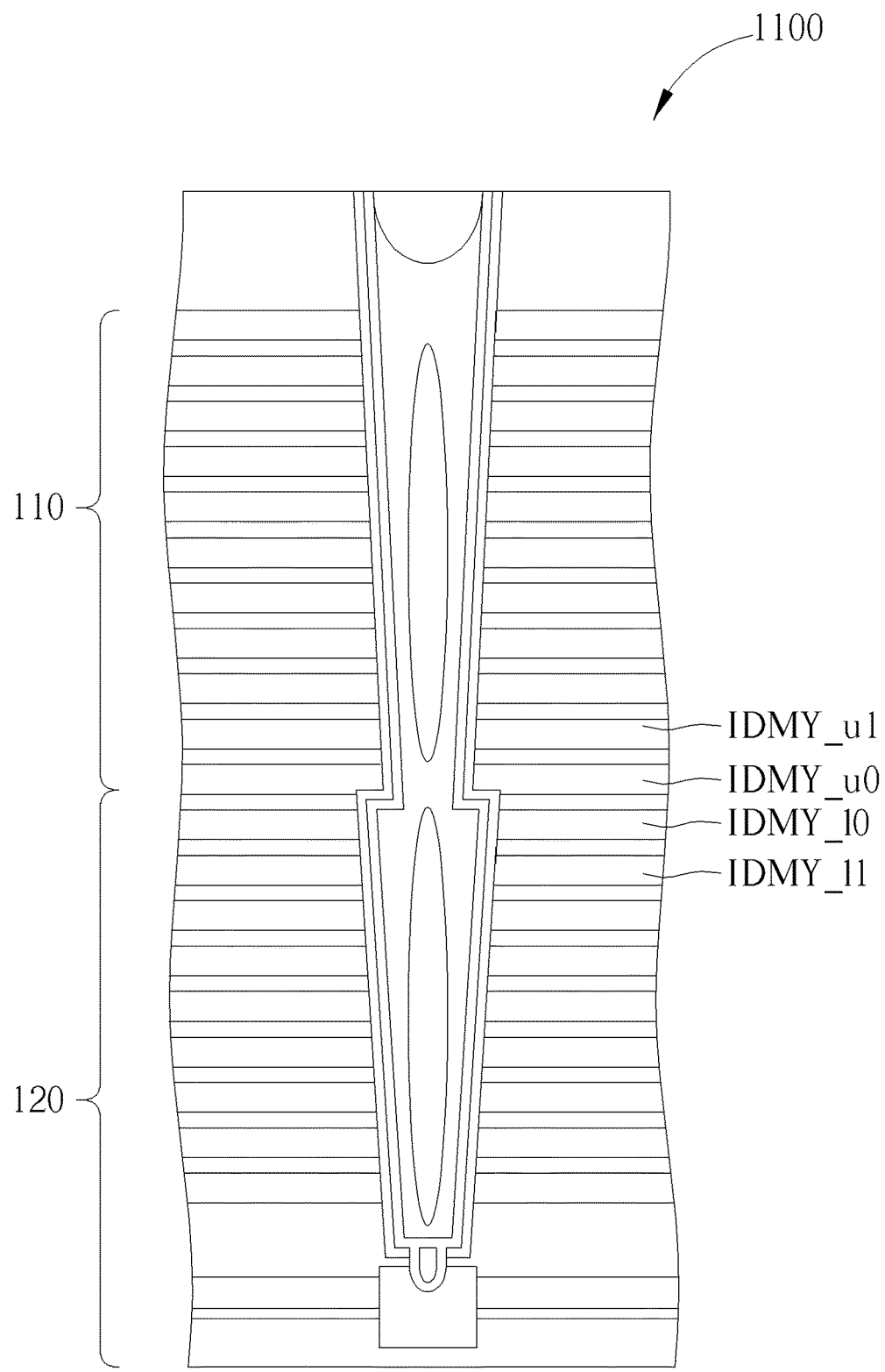

FIG. 10 is a waveform of controlling the memory 100 of FIG. 7 according to another embodiment. FIG. 10 may be similar to FIG. 9. The similarities of FIG. 10 and FIG. 9 are not described repeatedly.

As FIG. 9, in FIG. 10, a pre-pulse operation may be performed before a program operation.

During the pre-pulse operation, the first upper bias voltage V_u0, the first lower bias voltage V_10, the second lower bias voltage V_11, and the second upper bias voltage V_u1 may be set to a first pre-pulse level Vp1, a second pre-pulse level Vp2, a third pre-pulse level Vp3 and a fourth pre-pulse level Vp4 respectively.

During the program operation, the first upper bias voltage V_u0, the first lower bias voltage V_10, the second lower bias voltage V_11, and the second upper bias voltage V_u1 may be set to a first program level Vpass1, a second program level Vpass2, a third program level Vpass3 and a fourth program level Vpass4 respectively.

In FIG. 10, each of the first pre-pulse level Vp1, the second pre-pulse level Vp2, the third pre-pulse level Vp3 and the fourth pre-pulse level Vp4 may be higher than a maximum allowable level Vt max of the first upper threshold voltage Vt_u0, the first lower threshold voltage Vt_10, the second lower threshold voltage Vt_11 and the second upper threshold voltage Vt_u1.

In FIG. 10, the bias voltages V_u0, V_10, V_11 and V_u1 may be supplied separately for better controllability and flexibility.

The waveforms in FIG. 9 and FIG. 10 may be applied when programming a word line of the lower deck 120. When programming a word line of the upper deck 110, the bias voltages V_u0, V_10, V_11 and V_u1 may be 0 volts during the pre-pulse operation.

FIG. 11 to FIG. 14 illustrate a memory 1100 according to different embodiments. Like the memory 100 described above, the memory 1100 may include an upper deck 110 and a lower deck 120. However, the memory 1100 may not include the joint oxide layer 155 shown in FIG. 1. Compared with the memory 100, program disturbance may be more severe when programming the memory 1100.

FIG. 11 to FIG. 14 may be similar to FIG. 1, FIG. 3, FIG. 5 and FIG. 7 respectively.

The equations and inequalities corresponding to FIG. 1, FIG. 3, FIG. 5 and FIG. 7 described above may be respectively applied to the cases of FIG. 11 to FIG. 14 for reducing program disturbance. The equations and inequalities are not described repeatedly.

In summary, by adjusting the bias voltage(s) and the threshold voltage(s) related to dummy word lines (e.g. IDMY_u0, IDMY_10, IDMY_11 and IDMY_u1 mentioned above) in a three-dimensional memory, program disturbance may be reduced. According to embodiments, program disturbance occurred when programming a word line of an upper deck may be better reduced. Hence, the problem in the field may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reducing program disturbance of a memory, the memory comprising an upper deck and a lower deck, the upper deck being formed above the lower deck, the upper deck comprising a first upper dummy word line, the lower deck comprising a first lower dummy word line, the method comprising:

adjusting a first upper bias voltage applied to the first upper dummy word line and/or a first upper threshold voltage of the first upper dummy word line to adjust a first difference between the first upper bias voltage and the first upper threshold voltage; and adjusting a first lower bias voltage applied to the first lower dummy word line and/or a first lower threshold voltage of the first lower dummy word line to adjust a second difference between the first lower bias voltage and the first lower threshold voltage.

2. The method of claim 1, wherein:
the first difference is adjusted to be lower than a threshold; and
the second difference is adjusted to be lower than the threshold.

3. The method of claim 1, wherein:
the first difference is adjusted to be higher than a threshold; and
the second difference is adjusted to be higher than the threshold.

4. The method of claim 1, wherein the lower deck further comprises a second lower dummy word line, and the method further comprising:
adjusting a second lower bias voltage applied to the second lower dummy word line and/or a second lower threshold voltage of the second lower dummy word line to adjust a third difference between the second lower bias voltage and the second lower threshold voltage.

5. The method of claim 4, wherein:
the first difference is adjusted to be higher than a threshold;
the second difference is adjusted to be lower than the threshold; and
the third difference is adjusted to be lower than the threshold.

6. The method of claim 4, wherein a difference between the first difference and the second difference is within a predetermined range, and another difference between the first difference and the third difference is within the predetermined range.

7. The method of claim 1, wherein the upper deck further comprises a second upper dummy word line, and the method further comprising:
adjusting a second upper bias voltage applied to the second upper dummy word line and/or a second upper threshold voltage of the second upper dummy word line to adjust a fourth difference between the second upper bias voltage and the second upper threshold voltage.

8. The method of claim 7, wherein:
the first difference is adjusted to be lower than a threshold;
the second difference is adjusted to be lower than the threshold; and
the fourth difference is adjusted to be higher than the threshold.

9. The method of claim 8, wherein a difference between the fourth difference and the first difference is within a predetermined range, and another difference between the fourth difference and the second difference is within the predetermined range.

10. The method of claim 1, wherein the upper deck further comprises a second upper dummy word line, the lower deck further comprises a second lower dummy word line, and the method further comprising:
adjusting a second lower bias voltage applied to the second lower dummy word line and/or a second lower threshold voltage of the second lower dummy word line to adjust a third difference between the second lower bias voltage and the second lower threshold voltage; and
adjusting a second upper bias voltage applied to the second upper dummy word line and/or a second upper threshold voltage of the second upper dummy word line to adjust a fourth difference between the second upper bias voltage and the second upper threshold voltage.

11. The method of claim 10, wherein:
the first difference is adjusted to be lower than a first threshold;
the second difference is adjusted to be lower than a second threshold;
the third difference is adjusted to be lower than the first threshold; and
the fourth difference is adjusted to be higher than the second threshold.

12. The method of claim 10, wherein a difference between the fourth difference and the first difference is within a predetermined range, and another difference between the fourth difference and the second difference is within the predetermined range.

13. The method of claim 10, wherein a difference between the fourth difference and the second difference is within a predetermined range, and another difference between the fourth difference and the third difference is within the predetermined range.

14. The method of claim 10, further comprising:
setting the first upper bias voltage, the first lower bias voltage, the second lower bias voltage and the second upper bias voltage to a pre-pulse level during a pre-pulse operation; and
setting the first upper bias voltage, the first lower bias voltage, the second lower bias voltage and the second upper bias voltage to a program level during a program operation;
wherein and the pre-pulse level is higher than a maximum allowable level of the first upper threshold voltage, the first lower threshold voltage, the second lower threshold voltage and the second upper threshold voltage.

15. The method of claim 10, further comprising:
setting the first upper bias voltage, the first lower bias voltage, the second lower bias voltage, and the second upper bias voltage to a first pre-pulse level, a second pre-pulse level, a third pre-pulse level and a fourth pre-pulse level respectively during a pre-pulse operation; and
setting the first upper bias voltage, the first lower bias voltage, the second lower bias voltage, and the second upper bias voltage to a first program level, a second program level, a third program level and a fourth program level respectively during a program operation;
wherein each of the first pre-pulse level, the second pre-pulse level, the third pre-pulse level and the fourth pre-pulse level is higher than a maximum allowable level of the first upper threshold voltage, the first lower threshold voltage, the second lower threshold voltage and the second upper threshold voltage.

16. A memory for reducing program disturbance, comprising:
an upper deck comprising a first upper dummy word line configured to receive a first upper bias voltage and have a first upper threshold voltage; and
an lower deck comprising a first lower dummy word line configured to receive a first lower bias voltage and have a first lower threshold voltage;
wherein the upper deck is formed above the lower deck, the first upper bias voltage and/or the first upper threshold voltage is adjusted to adjust a first difference between the first upper bias voltage and the first upper threshold voltage, and the first lower bias voltage and/or the first lower threshold voltage is adjusted to adjust a second difference between the first lower bias voltage and the first lower threshold voltage.

17. The memory of claim 16, wherein the lower deck further comprises a second lower dummy word line configured to receive a second lower bias voltage and have a second lower threshold voltage, and the second lower bias voltage and/or the second lower threshold voltage is adjusted to adjust a third difference between the second lower bias voltage and the second lower threshold voltage.

18. The memory of claim 16, wherein the upper deck further comprises a second upper dummy word line configured to receive a second upper bias voltage and have a second upper threshold voltage, and the second upper bias voltage and/or the second upper threshold voltage is adjusted to adjust a fourth difference between the second upper bias voltage and the second upper threshold voltage.

19. The memory of claim 16, further comprising a joint oxide layer formed between the upper deck and the lower deck.

20. The memory of claim 16, further comprising a select top gate electrode, a select word line, an unselect word line, a dummy word line, a select bit line and a bottom select gate electrode.

\* \* \* \* \*